VOLTAGE TO FREQUENCY CONVERTER

Filed Feb. 20, 1968 2 Sheets-Sheet 1

INVENTORS:
ROBERT L. JAMES
EDWARD O. FRIEDMAN
BY
Anthony J. Rosco
ATTORNEY

VOLTAGE TO FREQUENCY CONVERTER

Filed Feb. 20, 1968 2 Sheets-Sheet 2

INVENTOR.
ROBERT L. JAMES
BY EDWARD O. FRIEDMAN
Anthony J. Cross
ATTORNEY 3,504,267
VOLTAGE TO FREQUENCY CONVERTER Robert L. James, Bloomfield, and Edward O. Friedman, Oradell, N.J., assignors to The Bendix Corporation, a corporation of Delaware Filed Feb. 20, 1968, Ser. No. 706,834
Int. Cl. H02m 7/42
U.S. Cl. 321—8 6 Claims

ABSTRACT OF THE DISCLOSURE

Apparatus for providing pulses at a frequency which varies linearly with a direct current signal and including an amplifier initially saturated in one sense and becoming saturated in another sense when the signal is above a predetermined threshold. A switching device is thereupon rendered conductive for applying a constant level voltage to switch the amplifier back to saturation in the one sense. The pulses are provided as the amplifier is alternately switched to saturation in the one and the other sense. Means are provided for varying the threshold of the amplifier and for varying the linearity range of the pulses.

BACKGROUND OF THE INVENTION

Field of the invention

This invention relates to means for converting a direct current signal into pulses corresponding thereto. More particularly, this invention relates to a novel circuit for converting a direct current signal into pulses at a frequency which varies linearly with said signal.

Description of the prior art

Prior to the present invention voltage to frequency converters of the type described had poor linearity and were relatively unstable. Moreover, the circuitry was complex and circuit adjustment was difficult. These converters left much to be desired when used, for example, in automatic flight control systems.

SUMMARY OF THE INVENTION

The present invention contemplates a device simple in construction and having relatively high reliability for providing pulses at a frequency corresponding to a direct current input signal. The input signal is applied through a capacitor to an amplifier which is initially saturated in one sense. As the input signal increases in the one sense, the capacitor charges and when the voltage applied to the amplifier exceeds a predetermined threshold, the amplifier becomes saturated in another sense. A transistor is thereupon rendered conductive and applies a constant level D.C. voltage to the capacitor. The capacitor rapidly charges to the level of the D.C. voltage signal and whereupon the amplifier becomes saturated in the one sense. The pulses are provided as the amplifier alternately saturates in the one and the other sense. An external signal is applied to the amplifier through a resistor, and which resistor may be varied for effecting the threshold of the amplifier. The linear range of the device is affected by varying the level of the D.C. voltage applied to the capacitor. Means are provided for sensing the polarity of the input signal and for effecting the amplifier output so that the same pulse frequency is provided regardless of the polarity of the input signal, One object of this invention is to provide a voltage to frequency converter having the advantages of circuit simplicity and relatively high reliability.

Another object of this invention is to convert direct current signals into pulses of corresponding frequency for use in automatic control systems.

Another object of this invention is to provide means for converting a direct current signal into pulses at a frequency linearly proportional to the direct current signal.

Another object of this invention is to provide a voltage to frequency converter of the type described having relatively good linearity over a wide range.

Another object of this invention is to provide a voltage to frequency converter of the type described and including an amplifier responsive to input signals above a preselected threshold for providing pulses at a frequency which varies linearly with the input signal, and wherein the threshold and linearity range of the amplifier are variable.

Another object of this invention is to provide a voltage to frequency converter of the type described and wherein the pulse frequency is independent of input signal polarity.

The foregoing and other objects and advantages of the invention will appear more fully hereinafter from a consideration of the detailed description which follows, taken together with the accompanying drawings wherein several embodiments of the invention are illustrated by way of example. It is to be expressly understood, however, that the drawings are for illustration purposes only and are not to be construed as defining the limits of the invention.

DESCRIPTION OF THE INVENTION

Figure 1:
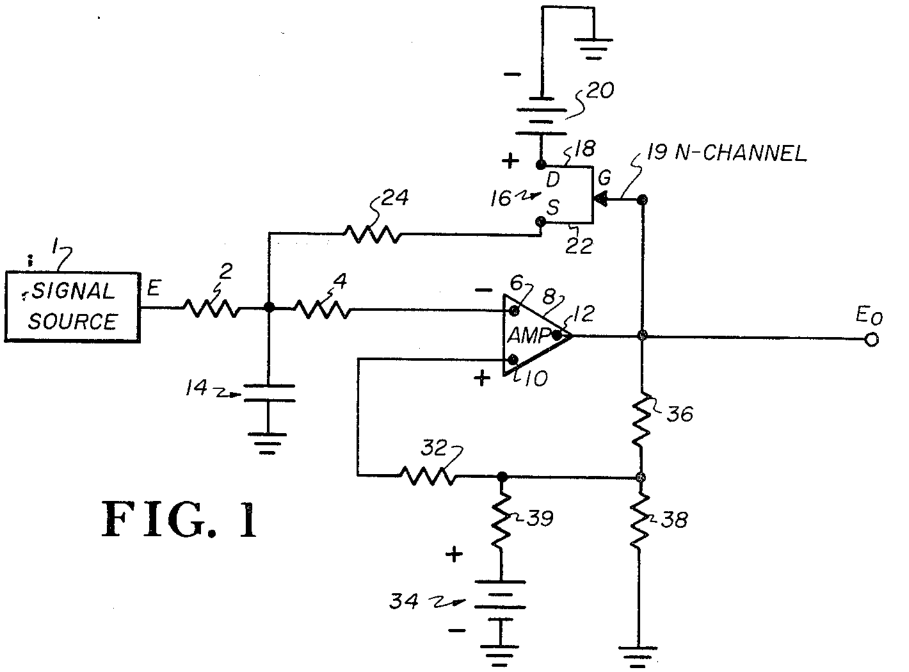
FIGURE 1 is an electrical schematic diagram showing a device constructed according to one embodiment of the invention for converting a direct current signal of one polarity into pulses at a frequency corresponding to the input signal.

With reference to FIGURE 1, a direct current or demodulated alternating current input signal E, such as may be used, for example, in a flight control system, is provided by a signal source 1 and applied therefrom through a resistor 2, a capacitor 14 having a plate connected to resistor 2 and another plate connected to ground, and a resistor 4 to an inverting input 6 of an operational amplifier 8. Amplifier 8 has a non-inverting input 10 and an output 12.

The positive terminal of a suitable source of direct current such as a battery 20 is connected to a drain element 18 of an N-channel field effect transistor 16 having a gate element 19 and a source element 22. Battery 20 has a negative terminal connected to ground. Gate element 19 of transistor 16 is connected to output 12 of amplifier 8 and source element 22 is connected through a resistor 24 to resistor 4 and therefrom to inverting input 6 of amplifier 8. Output 12 of amplifier 8 is connected to ground through a resistor 36 and a resistor 38.

The positive terminal of a suitable source of direct current such as a battery 34 is connected through a resistor 32 and a resistor 39 to non-inverting input 10 of amplifier 8 and is connected through resistor 36 and resistor 39 to output 12 of amplifier 8. Battery 34 has a negative terminal connected to ground. Thus, amplifier 8 has a negative feedback path including transistor 16 and resistors 4 and 24 and a positive feedback path including resistors 32, 36, 38 and 39.

When input signal E from signal source 1 is, for example, negative and below a predetermined triggering or threshold level, amplifier 8 is at negative saturation and the output therefrom at output 12 is negative. As signal E increases in a negative sense, capacitor 14 charges and when the voltage at inverting input 6 of amplifier 8 exceeds the predetermined threshold level, amplifier 8 switches from negative saturation to positive saturation and the output therefrom at output 12 is positive. Hysteresis is produced in the positive feedback path and field effect transistor 16 in the negative feedback path is rendered conductive so that the positive voltage from battery 20 is applied to capacitor 14. Capacitor 14 then rapidly charges toward the level of the voltage from battery 20, and when the voltage at input 6 becomes more positive than that at input 10, amplifier 8 is switched to negative saturation with transistor 16 being thereupon rendered nonconductive. The aforenoted cycle is repeated so that the output at output 12 of amplifier 8 is alternately positive and negative going for providing pulses $E_n$.

This phenomenon may be further explained with reference to FIGURE 3. With signal E at some negative value, the voltage across capacitor 14, and which voltage is designated as $V_c$, decreases until it reaches a value $V_{min}$. At this time the output of amplifier 8 switches polarity and the positive voltage from battery 20 is applied to capacitor 14 through transistor 16 rendered conductive as heretofore noted. Capacitor voltage $V_c$ then increases during an interval $T_R$ and at a positive rate. When voltage $V_c$ reaches a level $V_{max}$, amplifier 8 returns to negative saturation with capacitor voltage $V_c$, in turn, decreasing because of the negative input signal.

Figure 3:
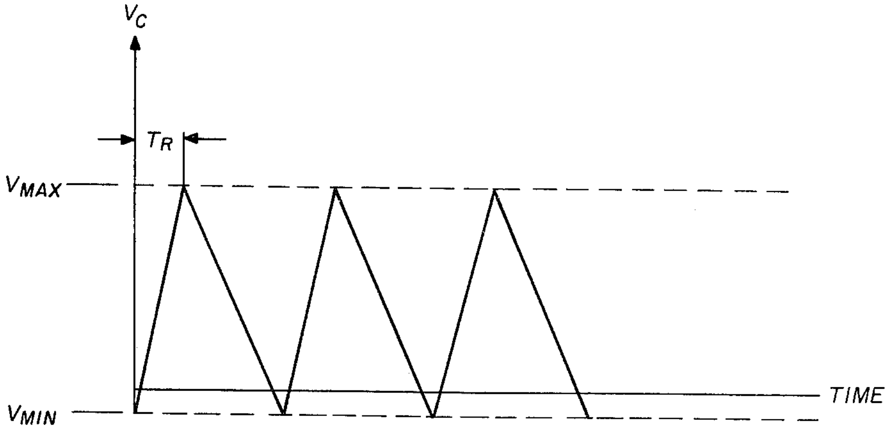
FIGURE 3 is a graphical representation showing the rise time of a voltage provided across a capacitor 14 shown in FIGURES 1 and 2.

Because of small variations in capacitor voltage $V_c$, rise time $T_R$ and the positive going slope of voltage $V_c$ as shown in FIGURE 3 are relatively constant. In this connection it is to be noted that the aforementioned condition exists as long as input signal E is sufficiently less than the voltage from battery 20, and which battery voltage may be increased to extend the linearity range of the present invention.

The threshold level of amplifier 8 may be adjusted to any reasonable value by changing the value of resistor 39 since the external voltage from battery 34, and which voltage is applied to inverting input 10 of amplifier 8, adds to or subtracts from input signal E.

The embodiment of the invention shown in FIGURE 1 is sufficient for input signals E of one polarity on another. For maximum utility, however, a bi-polar configuration is desirable, and wherein the device provides the same output pulse frequency regardless of input signal polarity.

With reference, then, to FIGURE 3, a polarity sensor 40 is connected to signal source 1 and provides a logic signal for switching in and out certain polarity dependent portions of the cricuitry as will be next explained.

Figure 2:
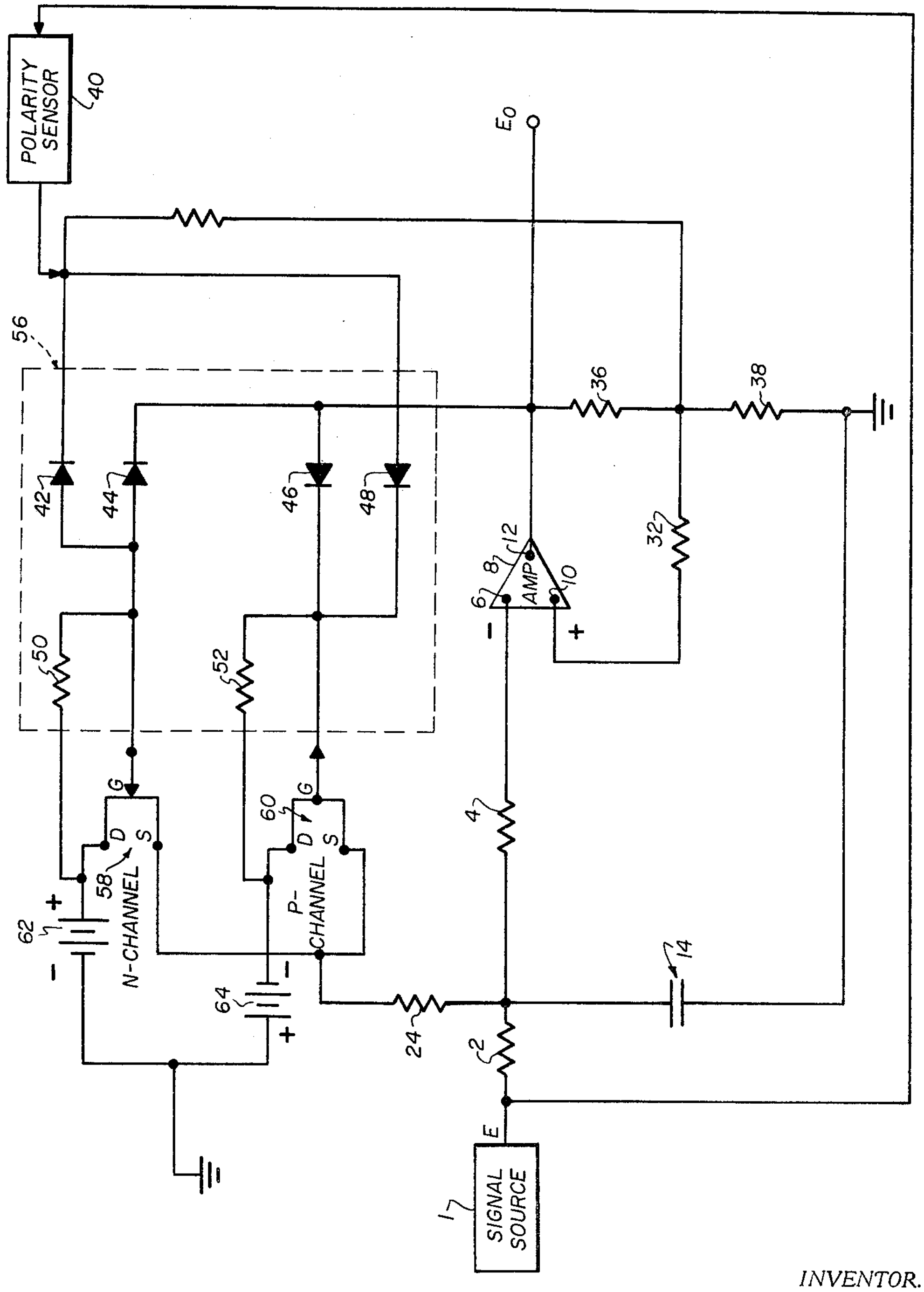
FIGURE 2 is an electrical schematic diagram showing a device constructed according to another embodiment of the invention for converting direct current signals of both polarities into pulses at a frequency corresponding to the input signal.

By comparing the device of FIGURE 1 with that of FIGURE 2, it is seen that diodes 42, 44, 46 and 48 and resistors 50 and 52 have been added to provide, in effect, a logic gate and which gate is designated by the numeral 56. The N-channel transistor 16 of FIGURE 1 has been replaced with dual complementary N- and P-channel transistors 58 and 60, and which transistors 58 and 60 are biased by the voltages from batteries 62 and 64, respectively. Since, as seen from FIGURE 1, the only portion of the circuit affected by input voltage polarity is transistor 16 and its supply voltage from battery 20, logic gate 56 is used to switch in or out of the circuit either transistor 58 or transistor 60 according to the polarity of input signal E.

Referring again to FIGURE 2, when input signal E from signal source 1 is, for purposes of example, positive, polarity sensor 40 provides a negative D.C. voltage at a predetermined level and which voltage is applied through diode 42 to the gate element of transistor 58 for holding transistor 58 in a cutoff or pinched off condition (i.e. nonconducting between the source and drain elements). The negative voltage from polarity sensor 40 is applied to the gate element of transistor 60 through diode 48, and which diode 48 is reverse-biased by the negative voltage from polarity sensor 40 so that transistor 60 is switched into the circuit.

Similarly, when input signal E is negative, polarity sensor 40 provides a positive D.C. voltage at a predetermined level causing transistor 58 to be switched into the circuit and transistor 60 to be cut off. Diodes 44 and 46 and resistors 50 and 52 provide conventional diode-resistor networks for coupling the voltages from polarity sensor 40 to the gate elements of transistors 58 and 60, respectively.

When signal E from signal source 1 is positive, field effect transistor 60 is effectively connected into the circuit and field effect transistor 58 is cut off as heretofore noted, the voltage at non-inverting input 10 of amplifier 8 is slightly positive and amplifier 8 is at positive saturation. The rising voltage across capacitor 14, affected by positive input signal E, eventually causes the voltage at inverting input 6 of amplifier 8 to be more positive than the voltage at non-inverting input 10, and whereupon amplifier 8 switches to negative saturation. With amplifier 8 at negative saturation, diode 48 is reverse biased and is at the same potential as the drain element of transistor 60 since the gate and drain elements of transistor 60 are connected through resistor 52. Transistor 60 is thereby rendered conductive between its source and drain elements since there is zero voltage difference between the gate and drain elements thereof.

The voltage from battery 64 is applied through resistor 24 to capacitor 14. This relatively large voltage and the low R-C path formed by resistor 24 and capacitor 14 rapidly drives the voltage at inverting input 6 of amplifier 8 toward the negative level of battery 64 until said voltage becomes slightly less negative than the voltage at non-inverting input 10. When this happens, amplifier 8 switches back to positive saturation with a slightly positive voltage at input 10 thereof. This entire cycle is then repeated to provide the pulse output $E_o$.

From the aforegoing discussion it is seen that the novel device of the present invention provides a voltage to frequency converter having the advantages of simplicity, quality, performance and high reliability. The device provides pulses at a frequency which varies linearly over a predetermined range with the range being independent of the saturation voltage of the amplifier. Moreover, the pulses are provided independent of capacitor discharge times and dependent only on small portions of capacitor charging times with the average D.C. charge on the capacitor 14 being constant for all input levels.

While several embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. Apparatus for converting a voltage from a voltage source into pulses at a frequency corresponding to said voltage, comprising:

an amplifier initially saturated in one sense;

a capacitor connected to the voltage source and to the amplifier and responsive to the voltage from the voltage source above a predetermined threshold in the one sense for affecting the amplifier so that said amplifier becomes saturated in the other sense;

means for providing a voltage in another sense;

current flow control means connected to the amplifier, to the means for providing a voltage in the other sense and to the capacitor, and responsive to the amplifier output when said amplifier is saturated in the other sense for applying the voltage in the other sense to the capacitor;

the capacitor being responsive to the voltage in the other sense applied thereto for affecting the amplifier so that the amplifier becomes saturated in the one sense; and the amplifier providing pulses at a frequency varying linearly with the voltage from the voltage source when alternately saturated in the one and the other sense.

2. Apparatus as described by claim 1, wherein:

the current flow control means is a uni-polar transistor having gate, source and drain elements;

the gate element is connected to the amplifier output;

the source element is connected to the capacitor; and the drain element is connected to the means for providing the voltage in the other sense.

3. Apparatus as described by claim 1, wherein the current flow control means includes:

other means for providing a voltage in the other sense;

a first current flow control device connected to the amplifier, to the other means for providing a voltage in the other sense and to the capacitor;

means for providing a voltage in the one sense; and a second current flow control device connected to the amplifier, to the means for providing a voltage in the one sense and to the capacitor.

4. Apparatus as described by claim 3, including:

a polarity sensor connected to the voltage source for providing an output in accordance with the sense of the voltage therefrom, and connected to the first and second current flow control means for rendering the first means effective to apply the voltage in the other sense to the capacitor when the input signal is of the one sense and for rendering the second means effective to apply the voltage in the one sense to the capacitor when the input signal is of the other sense.

5. Apparatus as described by claim 4, including:

first means for connecting the polarity sensor to the first current flow control device to render said device non-conductive when the input signal is of the other sense and to render said device conductive when the input signal is of the one sense, and second means for connecting the polarity sensor to the second current flow control device to render said device nonconductive when the input signal is of the one sense and to render said device conductive when the input signal is of the other sense.

6. Apparatus as described by claim 5, wherein:

the first current flow control device is a uni-polar transistor having a gate element connected to the first means, a drain element connected to the means for providing a voltage in the other sense and a source element connected to the capacitor; and the second current flow control device is a uni-polar transistor having a gate element connected to the second means, a drain element connected to the means for providing a voltage in the one sense and a source element connected to the capacitor.

References Cited

UNITED STATES PATENTS 3,191,071 6/1965 King et al. ........ 307—229 X
3,419,784 12/1968 Winn ................ 321—8

LEE T. HIX, Primary Examiner

W. H. BEHA, Jr., Assistant Examiner

U.S. Cl. X.R.

324—120; 307—229, 271; 328—127